United States Patent
Conti et al.

(10) Patent No.: US 7,491,660 B2
(45) Date of Patent: Feb. 17, 2009

(54) METHOD OF FORMING NITRIDE FILMS WITH HIGH COMPRESSIVE STRESS FOR IMPROVED PFET DEVICE PERFORMANCE

(75) Inventors: Richard A. Conti, Katohah, NY (US); Ronald P. Bourque, Wappingers Falls, NY (US); Nancy R. Klymko, Hopewell Junction, NY (US); Anita Madan, Danbury, NY (US); Michael C. Smits, Poughkeepsie, NY (US); Roy H. Tilghman, Stormville, NY (US); Kwong Hon Wong, Wappingers Falls, NY (US); Daewon Yang, Hopewell Junction, NY (US)

(73) Assignees: International Business Machines Corporation, Armonk, NY (US); Novellus Systems. Inc., San Jose, CA (US)

( * ) Notice: Subject to any disclaimer, the term of this patent is extended or adjusted under 35 U.S.C. 154(b) by 0 days.

(21) Appl. No.: 11/873,721

(22) Filed: Oct. 17, 2007

(65) Prior Publication Data

US 2008/0045039 A1 Feb. 21, 2008

Related U.S. Application Data

(62) Division of application No. 11/160,705, filed on Jul. 6, 2005.

(51) Int. Cl.
*H01L 21/31* (2006.01)
*H01L 21/469* (2006.01)
*C23C 16/00* (2006.01)
*C23C 14/10* (2006.01)
*C23C 14/00* (2006.01)

(52) U.S. Cl. .................. 438/791; 438/792; 427/255.23; 427/255.26; 427/255.27

(58) Field of Classification Search ................. 438/791, 438/792, 776; 257/E21.24; 427/255.23, 427/255.26, 255.27
See application file for complete search history.

(56) References Cited

U.S. PATENT DOCUMENTS

| | | | |
|---|---|---|---|
| 6,091,121 A | 7/2000 | Oda | |
| 6,140,255 A * | 10/2000 | Ngo et al. | 438/791 |
| 6,573,172 B1 | 6/2003 | En et al. | |
| 6,617,690 B1 | 9/2003 | Gates et al. | |
| 6,825,529 B2 | 11/2004 | Chidambarrao et al. | |
| 2005/0003671 A1 | 1/2005 | Liu et al. | |
| 2005/0202653 A1* | 9/2005 | Joshi et al. | 438/479 |

* cited by examiner

*Primary Examiner*—Ha Tran T Nguyen
*Assistant Examiner*—Valerie Brown
(74) *Attorney, Agent, or Firm*—Yuanmin Cai

(57) ABSTRACT

A method is provided for making a FET device in which a nitride layer overlies the PFET gate structure, where the nitride layer has a compressive stress with a magnitude greater than about 2.8 GPa. This compressive stress permits improved device performance in the PFET. The nitride layer is deposited using a high-density plasma (HDP) process, wherein the substrate is disposed on an electrode to which a bias power in the range of about 50 W to about 500 W is supplied. The bias power is characterized as high-frequency power (supplied by an RF generator at 13.56 MHz). The FET device may also include NFET gate structures. A blocking layer is deposited over the NFET gate structures so that the nitride layer overlies the blocking layer; after the blocking layer is removed, the nitride layer is not in contact with the NFET gate structures. The nitride layer has a thickness in the range of about 300-2000 Å.

12 Claims, 4 Drawing Sheets

US 7,491,660 B2

METHOD OF FORMING NITRIDE FILMS WITH HIGH COMPRESSIVE STRESS FOR IMPROVED PFET DEVICE PERFORMANCE

CROSS-REFERENCE TO RELATED APPLICATION

This application is a divisional application of a U.S. patent application Ser. No. 11/160,705, entitled "METHOD OF FORMING NITRIDE FILMS WITH HIGH COMPRESSIVE STRESS FOR IMPROVED PFET DEVICE PERFORMANCE", filed on Jul. 6, 2005.

FIELD OF THE INVENTION

This invention relates to the manufacture of advanced semiconductor devices, and particularly to improving charge mobility in high performance p-type field effect transistors (PFETs) in CMOS integrated devices.

BACKGROUND OF THE INVENTION

In the field of semiconductor device design, it is known that mechanical stresses within the device substrate can affect device performance. Stress engineering has come to play an important role in improving the performance of semiconductor devices. In the case of field-effect transistors (FETs), stress is applied to the channel region of the FET to cause increased mobility of electrons or holes, which in turn gives a substantial improvement in device speed. In a typical CMOS integrated circuit device, both n-type and p-type FETs (NFETs and PFETs respectively) are used. The stress components for the NFET and PFET in a given device must be engineered and applied differently, in accordance with the type of device and whether the direction is longitudinal (on the same axis as the channel current) or transverse to the channel current. It is known that the best stress design provides tensile stress in both longitudinal and transverse directions in the channel region under the gate of the NFET, but longitudinal compressive stress and transverse tensile stress in the channel region under the gate of the PFET.

FIGS. 1A and 1B schematically illustrate a typical device with the desired stress arrangement. FIG. 1A is a cross-section view of NFET and PFET gate structures 10, 20 formed on substrate 1 with an isolation region 15 (generally shallow-trench isolation or STI) between them. The NFET and PFET gate materials 11, 21 have channel regions 13, 23 beneath them. FIG. 1B is a plan view of the channel regions with the desired stresses, where arrows T and C represent tensile stress and compressive stress respectively.

U.S. Pat. No. 6,825,529 to Chidambarrao et al., assigned to one of the assignees of the present invention, describes the use of nitride spacers (12 and 22 in FIG. 1A) with different values of intrinsic stress to obtain the desired longitudinal stresses in the channel regions. According to Chidambarrao et al., it is also known that a nitride layer with high intrinsic stress, deposited over the completed NFET or PFET device, will induce corresponding stress in the channel.

The nitride films used in these techniques are deposited by plasma-enhanced CVD (PECVD). Whether a film has intrinsic tensile stress or compressive stress depends on the details of the deposition process. A number of PECVD processes and tools have been used in attempts to maximize intrinsic compressive stress in nitride films used in the PFET devices. At present the greatest compressive stress achievable in PECVD nitride appears to be about −2.6 GPa. There is a need for a process which can provide significantly greater intrinsic compressive stress in the deposited nitride film.

SUMMARY OF THE INVENTION

The present invention addresses the above-described need by providing a method for making a FET device in which a nitride layer overlies the PFET gate structure, where the nitride layer has a compressive stress with a magnitude greater than about 2.8 GPa. According to the present invention, this is done by depositing the nitride layer using a high-density plasma (HDP) process. In the HDP process, the substrate is disposed on an electrode to which a bias power is supplied. The bias power is in the range of about 50 W to about 150 W for a 200 mm diameter substrate, and in the range of about 300 W to about 500 W for a 300 mm diameter substrate. The bias power is characterized as high-frequency power, typically supplied by an RF generator at 13.56 MHz. The FET device may also include NFET gate structures. A blocking layer is deposited over the NFET gate structures so that the nitride layer overlies the blocking layer; after the blocking layer is removed, the nitride layer is not in contact with the NFET gate structures.

According to another aspect of the invention, a process for depositing a nitride layer on a workpiece is provided. A precursor gas mixture including silane and nitrogen is provided in a plasma reactor, main power is supplied to form a plasma in the reactor, and a bias power, at a frequency higher than that of the main power, is supplied to an electrode in the reactor on which the workpiece is disposed. This process results in deposition of a nitride layer having a compressive stress with a magnitude greater than about 2.8 GPa.

According to another aspect of the invention, a FET structure is provided which includes a PFET gate structure with a nitride layer overlying the gate structure. The nitride layer has a compressive stress with a magnitude greater than about 2.8 GPa. The nitride layer has a thickness in the range of about 300-2000 Å, depending on the design of the gate. The FET structure may also include a NFET gate structure, but the nitride layer is not in contact therewith.

DETAILED DESCRIPTION OF PREFERRED EMBODIMENT OF THE INVENTION

In a preferred embodiment of the invention, a nitride film is deposited on a substrate having a PFET device using a high-density plasma (HDP) process. In particular, the HDP nitride deposition process includes high frequency bias power.

Figure 1A:
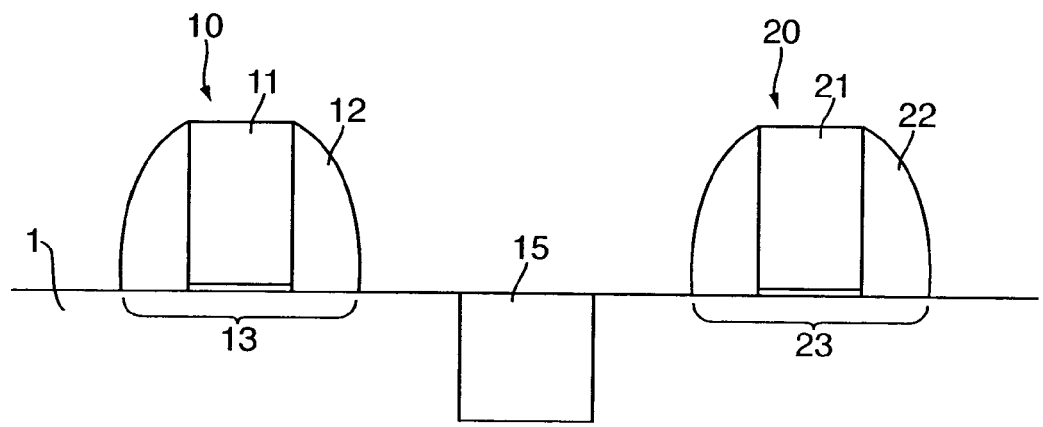
FIG. 1A is a schematic illustration in cross-section view of a typical CMOS device having NFET and PFET gate structures.
Figure 1B:
FIG. 1B is a schematic illustration in plan view of the gate channels in FIG. 1A, showing the desired longitudinal stress in the NFET and PFET respectively.
Figure 2:
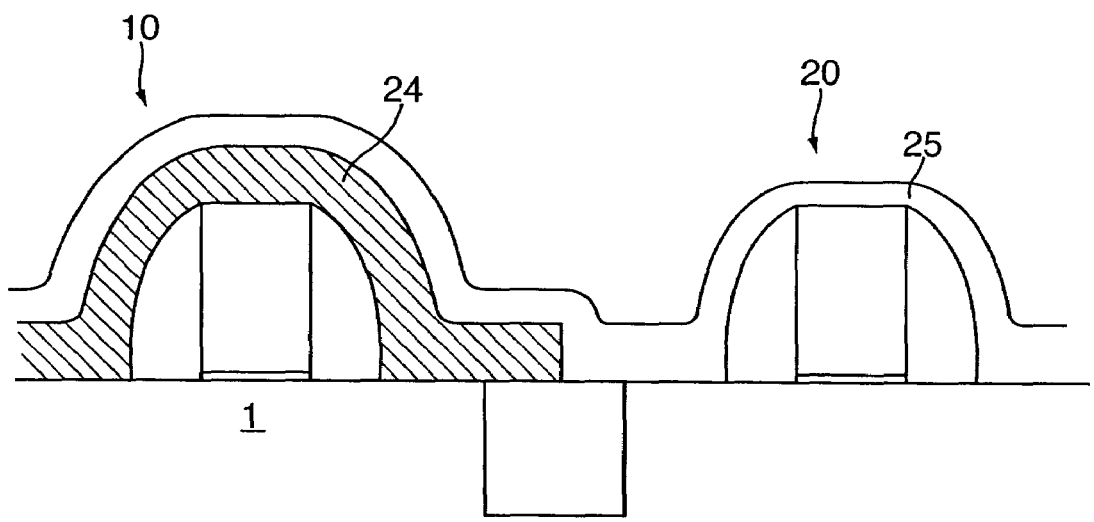
FIG. 2 shows an HDP nitride layer deposited on the PFET structure, in accordance with an embodiment of the invention.

The HDP nitride film 25 is deposited over the substrate 1 on which NFET and PFET gate structures 10, 20 have been formed, as shown in FIG. 2. The NFET gate structure is covered with a blocking layer 24 (e.g. photoresist) before the compressive nitride film is deposited, so that the nitride contacts the PFET only. A typical thickness for the nitride film 25 is in the range 300-2000 Å. The blocking layer is subsequently removed by any convenient process, so that compressive stress is applied to the PFET gate structures but not the NFET gate structures.

The processes described below have been implemented in a Novellus Speed HDP chemical vapor deposition tool from Novellus Systems, Inc. Argon, silane and nitrogen are used as precursor gases, with flow rates typically 350 sccm, 150 sccm and 600 sccm respectively when 200 mm substrates are used, and 230 sccm, 90 sccm and 310 sccm respectively when 300 mm substrates are used. During the deposition process the substrate temperature is about 375-400° C. and the gas pressure is less than 10 mTorr. The low frequency (LF) power is in the range 1000-2000 W for 200 mm substrates and in the range 2500-4000 W for 300 mm substrates. The high frequency (HF) bias power is in the range 50-150 W when 200 mm substrates are used, and in the range 300-500 W when 300 mm substrates are used. Table 1 shows results of HDP nitride deposition on five 200 mm wafers with Ar, $SiH_4$ and $N_2$ flow rates as given above, with a total power of 1870 watts.

TABLE 1

| Wafer | LF power, watts | HF power, watts | Deposition rate, Å/sec | Temperature, °C. | Stress, GPa |
|---|---|---|---|---|---|
| 1 | 1870 | 0 | 22.6 | 353 | −0.41 |
| 2 | 1770 | 100 | 23.8 | 367 | −2.8 |
| 3 | 1720 | 150 | 24.6 | 375 | −2.5 |
| 4 | 1670 | 200 | 24.8 | 381 | −2.4 |
| 5 | 1570 | 300 | 24.2 | 390 | −2.1 |

It is understood that the negative sign indicates that the stress is compressive. It may be seen from Table 1 that the magnitude of stress depends critically on the high frequency bias power.

Figure 3:
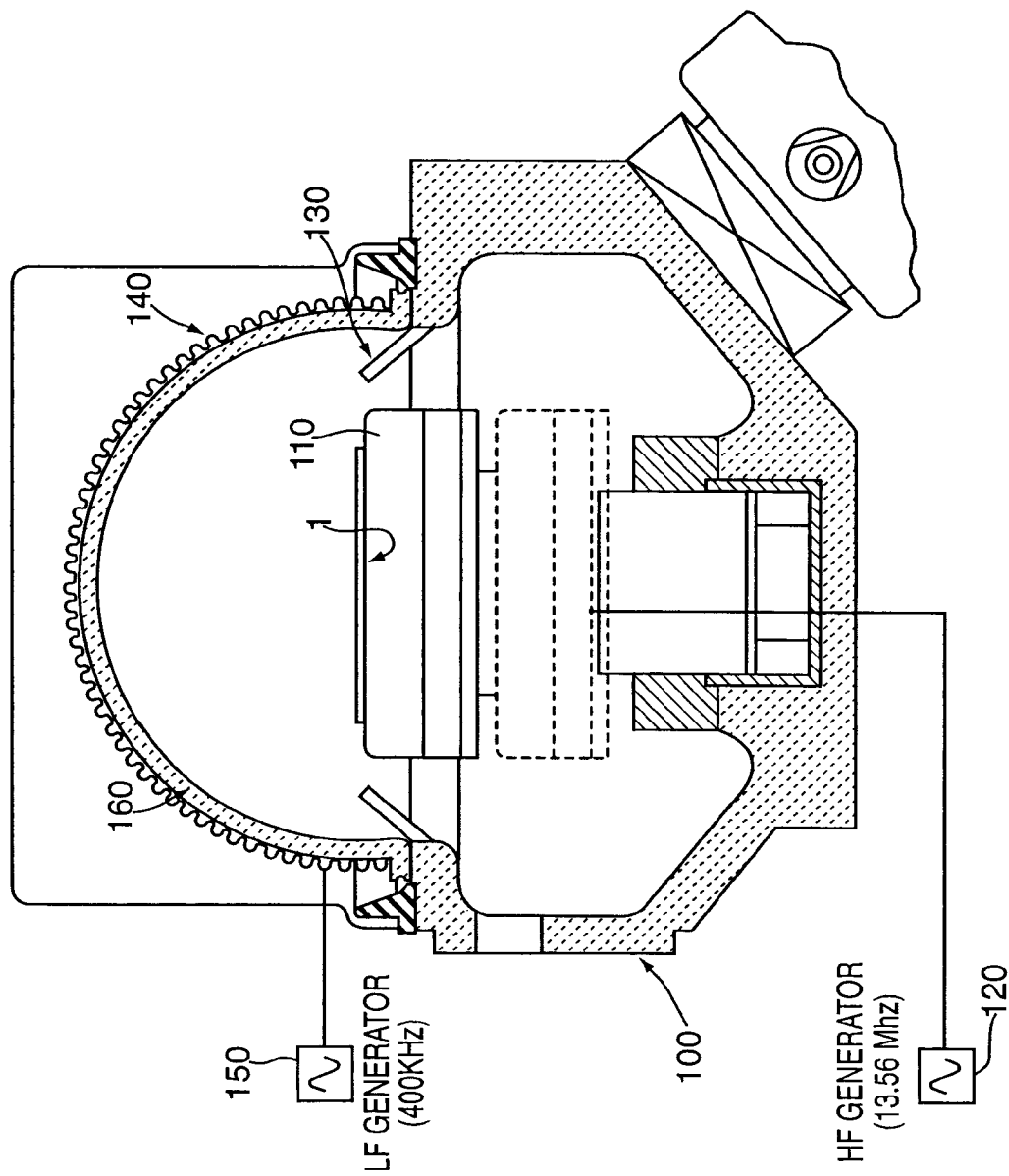
FIG. 3 schematically illustrates an HDP deposition tool in which high frequency bias power is applied, in accordance with the invention.

FIG. 3 is a schematic illustration of a HDP deposition tool 100 employing high frequency bias power. Process gases are introduced into the chamber through inlets 130. The high-density plasma is induced by the coils 140 (on the exterior of the dome-shaped chamber cover 160) connected to the low frequency RF generator 150. The substrate 1 is placed on electrode 110 connected to the high frequency RF generator 120. The HF generator 120 operates at the standard frequency of 13.56 MHz while the LF generator 150 typically operates at 400 KHz.

Figure 4:
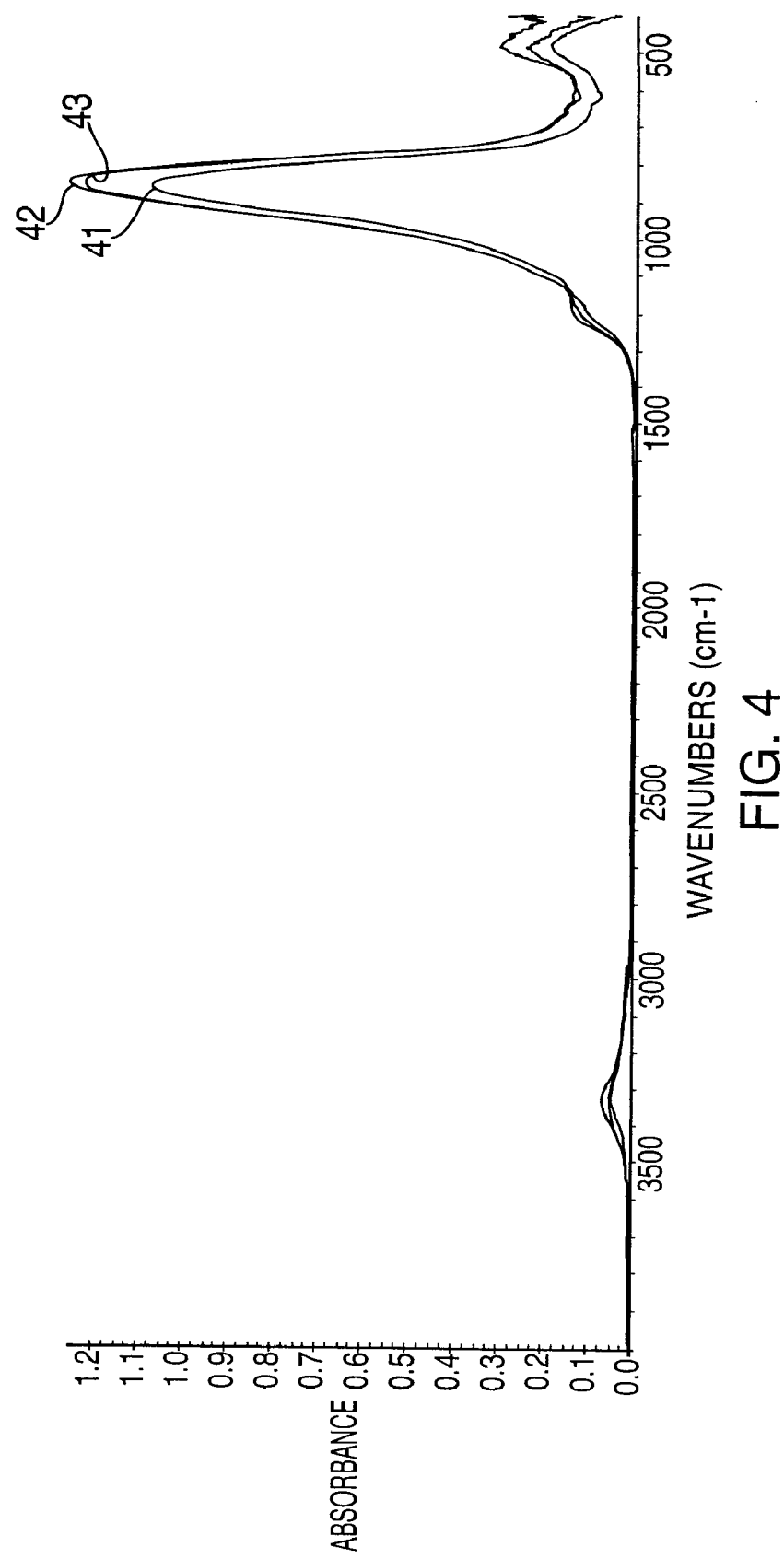
FIG. 4 shows FTIR spectra for three nitride films deposited using PECVD, HDP without high frequency bias, and HDP with 100 W high frequency bias, respectively.

A comparison of nitride films formed by PECVD and HDP processes has been performed using Fourier transform infrared spectroscopy (FTIR). FTIR spectra for three processes (PECVD, HDP without HF bias, and HDP with 100 W HF bias) are shown in FIG. 4. Spectrum 41 represents absorbance of a PECVD nitride film; spectra 42 and 43 represent absorbance of HDP nitride deposited without HF bias and with 100 W HF bias, respectively. The peaks at about 870 $cm^{-1}$ represent stretching of Si—N bonds; the difference in peak heights shows that the HDP nitride films have more Si—N bonding than PECVD nitride films. A further comparison of film properties, based on stress and density measurements in addition to FTIR, appears in Table 2.

TABLE 2

| Wafer | Process, bias power | Stress, GPa | Density, g/cm$^{-3}$ | [NH], cm$^{-3}$ | [SiH], cm$^{-3}$ | SiN stretching, normalized | NHx/SiN stretching |
|---|---|---|---|---|---|---|---|
| 1 | PECVD | −2.0 | 2.69 | 2.9E+22 | 8E+20 | 226 | 0.067 |
| 2 | HDP/0 W | −0.023 | 2.82 | 1.9E+22 | — | 257 | 0.040 |
| 3 | HDP/100 W | −3.3 | 2.78 | 2.4E+22 | — | 267 | 0.048 |

Compared to PECVD films, the HDP nitride films have higher density, more Si—N bonding, and a lower hydrogen content. In addition, the HDP films have lower concentrations of NH and no detectable SiH.

HDP deposited nitride films, which previously were used in semiconductor manufacturing for copper passivation and as etch stops, have thus been shown to be useful in providing very high compressive stress for performance enhancement in PFET devices. Compressive stresses of −3.0 GPa and greater may be obtained; this is a higher stress level than is available using PECVD processes.

While the invention has been described in terms of a specific embodiment, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A process for depositing a nitride layer on a workpiece, the process comprising:
   providing a precursor gas mixture including silane and nitrogen in a plasma reactor;
   supplying a main power to form a plasma inside the plasma reactor; and
   applying a bias power to an electrode, inside the plasma reactor and on which the workpiece is disposed, thereby causing deposition of the nitride layer on the workpiece, the bias power being a RF bias power having a frequency higher than that of the main power, the nitride layer being deposited on the workpiece having a compressive stress with a magnitude greater than about 2.8 GPa.

2. A process according to claim 1, wherein the main power is in the range of about 1000 W to about 4000 W.

3. A process according to claim 2, wherein the workpiece has a diameter of about 200 mm and the main power is in the range of about 1000 W to about 2000 W.

4. A process according to claim 2, wherein the workpiece has a diameter of about 300 mm and the main power is in the range of about 2500 W to about 4000 W.

5. A process according to claim 1, wherein the bias power is in the range of about 50 W to about 500 W.

6. A process according to claim 5, wherein the workpiece has a diameter of about 200 mm and the bias power supplied to the electrode is in the range of about 50 W to about 150 W.

7. A process according to claim 5, wherein the workpiece has a diameter of about 300 mm and the bias power supplied to the electrode is in the range of about 300 W to about 500 W.

8. A process according to claim 1, wherein the bias power is supplied by an RF generator at a frequency of about 13.56 MHz.

9. A process according to claim 1, wherein the main power is supplied by an RF generator at a frequency of about 400 KHz.

10. A process according to claim 1, wherein said silane and nitrogen in said precursor gas mixture are provided at a flow rate of around 150 sccm and 600 sccm respectively.

11. A process according to claim 1, wherein said precursor gas mixture further includes argon being provided at a flow rate of around 350 sccm.

12. A process according to claim 1, wherein a variation in the bias power causes a variation in the compressive stress of said nitride layer.

* * * * *